US012592717B2

(12) United States Patent
Trivedi et al.

(10) Patent No.: US 12,592,717 B2
(45) Date of Patent: Mar. 31, 2026

(54) INTEGRATOR CIRCUIT

(71) Applicant: NXP USA, Inc., Austin, TX (US)

(72) Inventors: Ronak Prakashchandra Trivedi,
Cupertino, CA (US); Hanqing Xing,
Cupertino, CA (US); Carmelo Morello,
San Jose, CA (US); Ranga Seshu
Paladugu, Milpitas, CA (US)

(73) Assignee: NXP USA, Inc., Austin, TX (US)

( * ) Notice: Subject to any disclaimer, the term of this
patent is extended or adjusted under 35
U.S.C. 154(b) by 147 days.

(21) Appl. No.: 18/674,377

(22) Filed: May 24, 2024

(65) Prior Publication Data

US 2025/0365005 A1 Nov. 27, 2025

(30) Foreign Application Priority Data

May 3, 2023 (EP) ..................................... 23171349

(51) Int. Cl.
*H03M 3/00* (2006.01)

(52) U.S. Cl.
CPC .................................... *H03M 3/32* (2013.01)

(58) Field of Classification Search
CPC ................................. H03M 3/00; H03M 3/32
See application file for complete search history.

(56) References Cited

U.S. PATENT DOCUMENTS 5,001,725 A * 3/1991 Senderowicz .......... H03M 3/34
375/247
5,745,060 A 4/1998 McCartney et al.

| | | | | |
|---|---|---|---|---|
| 5,818,377 A | * | 10/1998 | Wieser | ................ H03M 1/0665 341/143 |
| 6,097,249 A | * | 8/2000 | Strickland | ................. H03F 1/26 330/10 |
| 6,252,432 B1 | * | 6/2001 | Freitas | ................ H03F 3/45183 330/253 |
| 6,639,532 B1 | * | 10/2003 | Liu | ......................... H03M 3/34 341/172 |
| 7,167,119 B1 | | 1/2007 | Lei et al. | |
| 7,460,966 B1 | * | 12/2008 | Hattori | .................. H02J 7/0031 702/61 |
| 7,880,653 B2 | | 2/2011 | Hong et al. | |
| 8,635,261 B2 | * | 1/2014 | Tinker | ............... H03H 17/0628 708/313 |

(Continued)

FOREIGN PATENT DOCUMENTS

CN 101625718 B 11/2012

OTHER PUBLICATIONS

P. J. Hurst and W. J. McIntyre, "Double sampling in SC delta-sigma
A/D converters",€Proc. IEEE Int. Symp. Circuits Syst. (ISCAS),
pp. 902-905, May 1990.

*Primary Examiner* — Lam T Mai

(57) ABSTRACT

The disclosure relates to an integrator circuit for a Sigma-
Delta, $\Sigma\Delta$, modulator, the integrator circuit comprising an
integrator module comprising a differential amplifier, a
sampling module comprising sampling capacitors and a
reference module comprising first and second pluralities of
reference capacitors connected between respective first and
second lines and first and second pluralities of reference
switches for connecting each of the reference capacitors to
either a first reference terminal or a second reference ter-
minal. In operation, the reference switches are switched
according to a thermometrically coded quantizer signal.

20 Claims, 6 Drawing Sheets

(56)  References Cited

U.S. PATENT DOCUMENTS

| | | | | |
|---|---|---|---|---|
| 8,698,469 | B1 * | 4/2014 | Latham, II | H02M 1/15 |
| | | | | 323/283 |
| 2004/0008527 | A1 * | 1/2004 | Honda | H02M 1/12 |
| | | | | 363/39 |
| 2004/0140847 | A1 * | 7/2004 | Thompson | H03F 3/38 |
| | | | | 330/9 |
| 2004/0208046 | A1 * | 10/2004 | Yokozeki | G11C 11/22 |
| | | | | 365/145 |
| 2014/0277215 | A1 * | 9/2014 | Gordon | A61N 1/3981 |
| | | | | 607/2 |
| 2014/0368365 | A1 * | 12/2014 | Quiquempoix | H03M 3/496 |
| | | | | 341/143 |
| 2016/0048707 | A1 * | 2/2016 | Alladi | G06G 7/186 |
| | | | | 327/337 |
| 2016/0276839 | A1 * | 9/2016 | Engelhardt | H02M 1/44 |
| 2023/0421170 | A1 * | 12/2023 | Wada | H03M 3/458 |

* cited by examiner

INTEGRATOR CIRCUIT

CROSS-REFERENCE TO RELATED APPLICATIONS

This application claims priority under 35 U.S.C. § 119 to European patent application number 23171349.6, filed May 3, 2023, the contents of which are incorporated by reference herein.

FIELD

The disclosure relates to an integrator circuit for a Sigma-Delta ($\Sigma\Delta$) modulator.

BACKGROUND

Sigma-delta modulators may be used to perform analog-to-digital or digital-to-analog conversion. To perform analog-to-digital conversion, a conventional $\Sigma\Delta$ modulator measures and integrates the error in a signal and performs error correction based on the integrated error. A conventional $\Sigma\Delta$ modulator may include an integrator, a quantizer and a feedback loop. The order of the $\Sigma\Delta$ modulator is determined by the number of integrators. Single sampling and double sampling modulators are known.

A general problem to be addressed is in how to improve the signal-to-noise ratio (SNR) of a $\Sigma\Delta$ modulator while maintaining a low power consumption and a low overall area.

SUMMARY

According to a first aspect there is provided an integrator circuit for a Sigma-Delta ($\Sigma\Delta$) modulator, the integrator circuit comprising:

an integrator module comprising a differential amplifier having first and second inputs and first and second outputs, a first integrator capacitor connected between the first input and the first output, a second integrator capacitor connected between the second input and the second output;

a first line switchably connected to the first input of the differential amplifier via a first switch and to the second input of the differential amplifier via a second switch;

a second line switchably connected to the second input of the differential amplifier via a third switch and to the first input of the differential amplifier via a fourth switch;

first and second sampling capacitors connected between the first line and respective fifth and sixth switches, the fifth switch connecting the first sampling capacitor to either a first common terminal or a first differential input terminal, the sixth switch connecting the second sampling capacitor to either the first common terminal or a second differential input terminal;

third and fourth sampling capacitors connected between the second line and respective seventh and eighth switches, the seventh switch connecting the third sampling capacitor to either the first common terminal or the second differential input terminal, the eighth switch connecting the fourth sampling capacitor to either the first common terminal or the first differential input terminal;

a first plurality of reference capacitors connected between the first line and a respective first plurality of reference switches, each of the first plurality of reference switches connecting a respective one of the first plurality of reference capacitors to either a first reference terminal or a second reference terminal;

a second plurality of reference capacitors connected between the second line and a respective second plurality of reference switches, each of the second plurality of reference switches connecting a respective one of the second plurality of reference capacitors to either the first reference terminal or the second reference terminal;

a ninth switch connected between a second common terminal and the first line; and a tenth switch connected between the second common terminal and the second line.

The first and second pluralities of reference capacitors may be equal in number.

The first and second pluralities may be equal to 15. In a general aspect, the first and second pluralities may be equal to $2^N-1$, where N is an integer greater than 1.

The first and second pluralities of reference capacitors may have equal capacitance values.

The integrator circuit may comprise a clock signal generator configured to generate first and second non-overlapping clock signals of equal frequency.

The integrator circuit may comprise a switch control module configured to generate first and second switching signals for control of the first to eighth switches in combination with the first and second clock signals.

The first and second switching signals may have a period twice that of the first and second non-overlapping clock signals, the second switching signal being an inverse of the first switching signal.

The first, second, third and fourth sampling capacitors may have equal capacitance values.

According to a second aspect there is provided a Sigma-Delta ($\Sigma\Delta$) modulator comprising the integrator circuit according to the first aspect and a quantizer, wherein the quantizer is configured to provide a thermometrically coded output signal to operate the reference switches.

According to a third aspect there is provided a method of operating the integrator circuit according to the first aspect, the method comprising in sequence:

in a first sampling phase:

providing a first clock signal to close the ninth and tenth switches;

providing a first switching signal to operate the fifth, sixth, seventh and eighth switches to connect the first sampling capacitor to the first common terminal, the second sampling capacitor to the second differential input terminal, the third sampling capacitor to the first common terminal and the fourth capacitor to the first differential input terminal;

providing a thermometrically coded quantizer signal to operate the reference switches, connecting each of the first and second plurality of reference capacitors to either the first or second reference terminals;

in a first integration phase:

opening the ninth and tenth switches; and providing a second switching signal and a second clock signal to close the second and fourth switches.

The method may further comprise:

in a second sampling phase:

providing the first clock signal to close the ninth and tenth switches;

providing the second switching signal to operate the fifth, sixth, seventh and eighth switches to connect the first sampling capacitor to the first differential input terminal, the second sampling capacitor to the first common terminal, the third sampling capacitor to the second differential input terminal and the fourth capacitor to the first common terminal;

in a second integration phase:

providing an inverse of the thermometrically coded quantizer signal to operate the reference switches, connecting each of the first and second plurality of reference capacitors to either the first or second reference terminals;

opening the ninth and tenth switches; and providing the first switching signal and the second clock signal to close the first and third switches.

The sequence of the first sampling phase, the first integration phase, the second sampling phase and the second integration phase may be repeated.

The first and second clock signals may be non-overlapping and of equal frequency.

The first and second switching signals may have a period twice that of the first and second clock signals, the second switching signal being an inverse of the first switching signal.

For each of the first and second pluralities of reference switches, the number of reference switches connected to one of the reference terminals may be equal to the thermometrically coded quantizer signal.

The integrator circuit has the effect of improving the SNR of an ADC without increasing the average switching current drawn from an ADC input driver. This can be achieved without a significant increase in overall area and power consumption. The circuit may be beneficial in reducing an ADC input referred thermal noise and hence improving the SNR of a low power oversampled ADC.

The integrator circuit achieves a higher SNR without an increase in power consumption and without affecting the linearity of an ADC driver/buffer.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
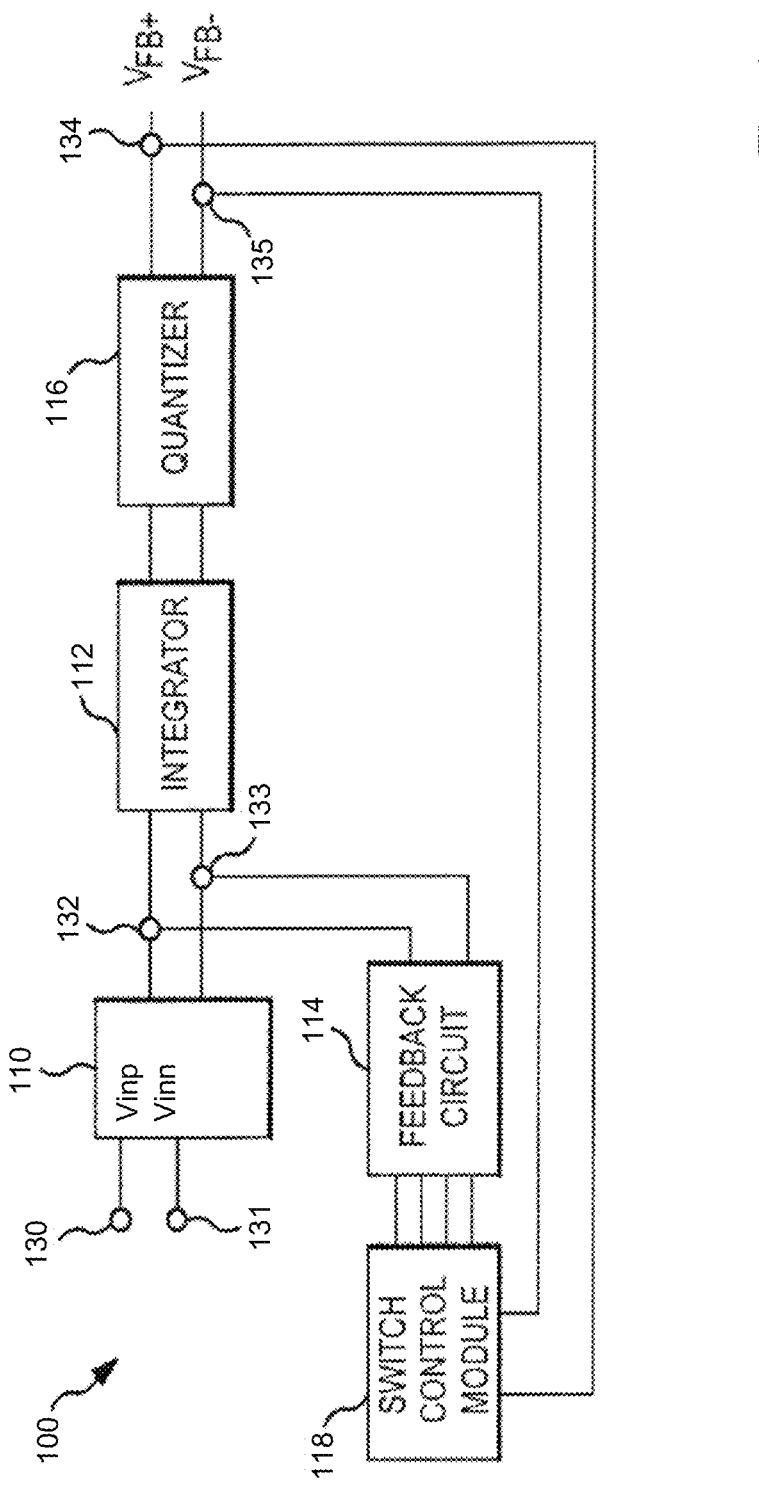
FIG. 1 is a schematic block diagram of an example $\Sigma\Delta$ modulator with a single integrator.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

A precision receiver (RX) system typically includes a precision programmable gain amplifier and high-resolution analog-to-digital converters in the signal path. In industrial input/output applications, it is becoming more demanding to have a transmitting path with around 18-bit accuracy and a receiving path with over 16-bit accuracy integrated in a single-chip solution. The receiver signal path needs to have a low noise voltage and current measurement from the input voltage/current channels. Each PGA (programmable gain amplifier) and ADC in the receiver signal path therefore need to have a high SNR (signal to noise ratio) equivalent to a 16-bit level. At the same time, the signal path modules need to consume very low current.

Usually, a high-resolution $\Sigma\Delta$ modulator is used for input quantization because of its high resolution and inherent linearity. Furthermore, the noise level of the $\Sigma\Delta$ modulator can be well-controlled by having a sufficient over sampling ratio (OSR). However, it is not always possible to meet low input referred noise requirement just by having a large OSR due to power consumption limitations with a high-speed sampling clock. In low power designs, the SNR is typically limited by input referred thermal noise rather than by quantization. With larger sampling capacitors and a higher OSR, in-band thermal noise can be reduced but at the cost of increased power consumption. Scaling of sampling capacitors can therefore result in an exponential increase in power consumption.

Sampling schemes exist to reduce the input referred thermal noise without scaling sampling capacitors. However, such schemes typically increase the input switching current. Therefore, to meet the high linearity requirement, an ADC driver may need to consume more power.

FIG. 1 illustrates an example single stage 2A modulator 100, as disclosed in U.S. Pat. No. 7,880,653. The modulator 100 includes an analog input module 110, an integrator 112, a quantizer 116, a switched-capacitor feedback circuit 114, and a switch control module 118. A differential signal to be integrated (e.g., a data-bearing, analog input signal) is received at differential input nodes 130, 131 of the analog input module 110. The analog input module 110 has a differential output coupled to summing nodes 132, 133 of the integrator 112, which receive input signals Vinp, Vinn. The analog input module 110 may provide a continuous-time input or a discrete-time input to the summing nodes 132, 133. More particularly, the analog input module 110 may provide a data-bearing, differential signal to the summing nodes 132, 133. The summing nodes 132, 133 also receive a differential signal produced by the switched capacitor feedback circuit 114 and produce a modified, data-bearing, differential signal that represents the combination of the data-bearing, differential signal from the analog input module 110 and the differential signal from feedback circuit 114.

The integrator 112 is adapted to integrate the differential signal at the summing nodes 132, 133. Signals present on differential output nodes of the integrator 112 are provided to the quantizer 116, which is adapted to quantize the integrated signal in order to produce a digital representation of the integrated signal. The quantizer 116 may include, for example, a high gain comparator that is adapted to saturate given any non-negligible input. The output of the quantizer 116 (i.e. the output of the $\Sigma\Delta$ modulator 200) includes a digital, binary value that is represented by two fixed voltages at output nodes 134, 135. These voltages are referred to in FIG. 2 as VFB+ and VFB−. When the input to the quantizer 116 is positive, VFB+=1 and VFB−=0. Alternatively, when the input to the quantizer 116 is negative, VFB+=0 and VFB−=1.

The output of the quantizer 116 is provided as a feedback signal to differential inputs of the switch control module 118. Based on the feedback signal and a reference clock signal (not illustrated), the switch control module 118 produces switching control signals to the switched-capacitor feedback circuit 114. These switching control signals may include, for example, an odd clock phase signal, an even clock phase signal, and additional signals having values based on the odd clock phase signal, the even clock phase signal, and the value of the feedback signal. The switched-capacitor feedback circuit 114 produces a differential output, which is provided to the summing nodes 132, 133 of the integrator 212.

Figure 2:
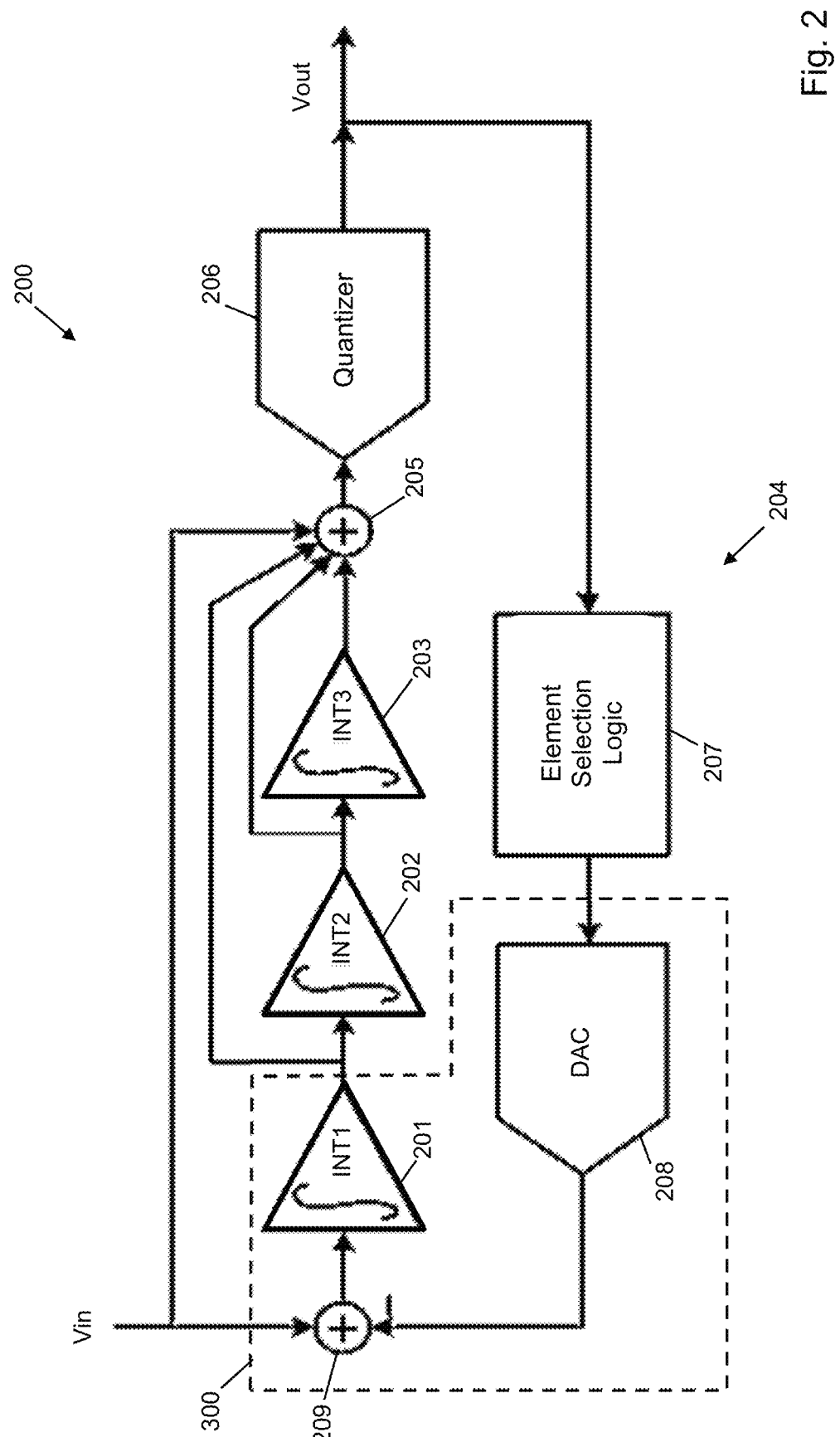
FIG. 2 is a schematic block diagram of an example $\Sigma\Delta$ modulator with multiple integrator stages.

FIG. 2 illustrates an example multiple stage 2A modulator 200. The modulator 200 comprises first, second and third stage integrators 201, 202, 203. The first stage integrator 201 receives an input signal Vin combined with a feedback signal from a feedback loop 204 via an input summing node 209. The first stage integrator 201 provides an output signal to the second stage integrator 202. The second stage integrator 202 provides an output signal to the third stage integrator 203. The third stage integrator 203 provides an output signal to an output summing node 205, which also receives inputs from the first and second stage integrators 201, 202 and the input signal Vin. The output summing node 205 provides a summed output to a quantizer 206, which provides an output signal Vout. The output signal Vout is also provided to the feedback loop 204, which comprises element selection logic 207 and a DAC 208, which provides the feedback signal. The element selection logic 207 and DAC correspond to the switch control module 118 and feedback circuit 114 of the modulator 100 in FIG. 1.

Figure 3:
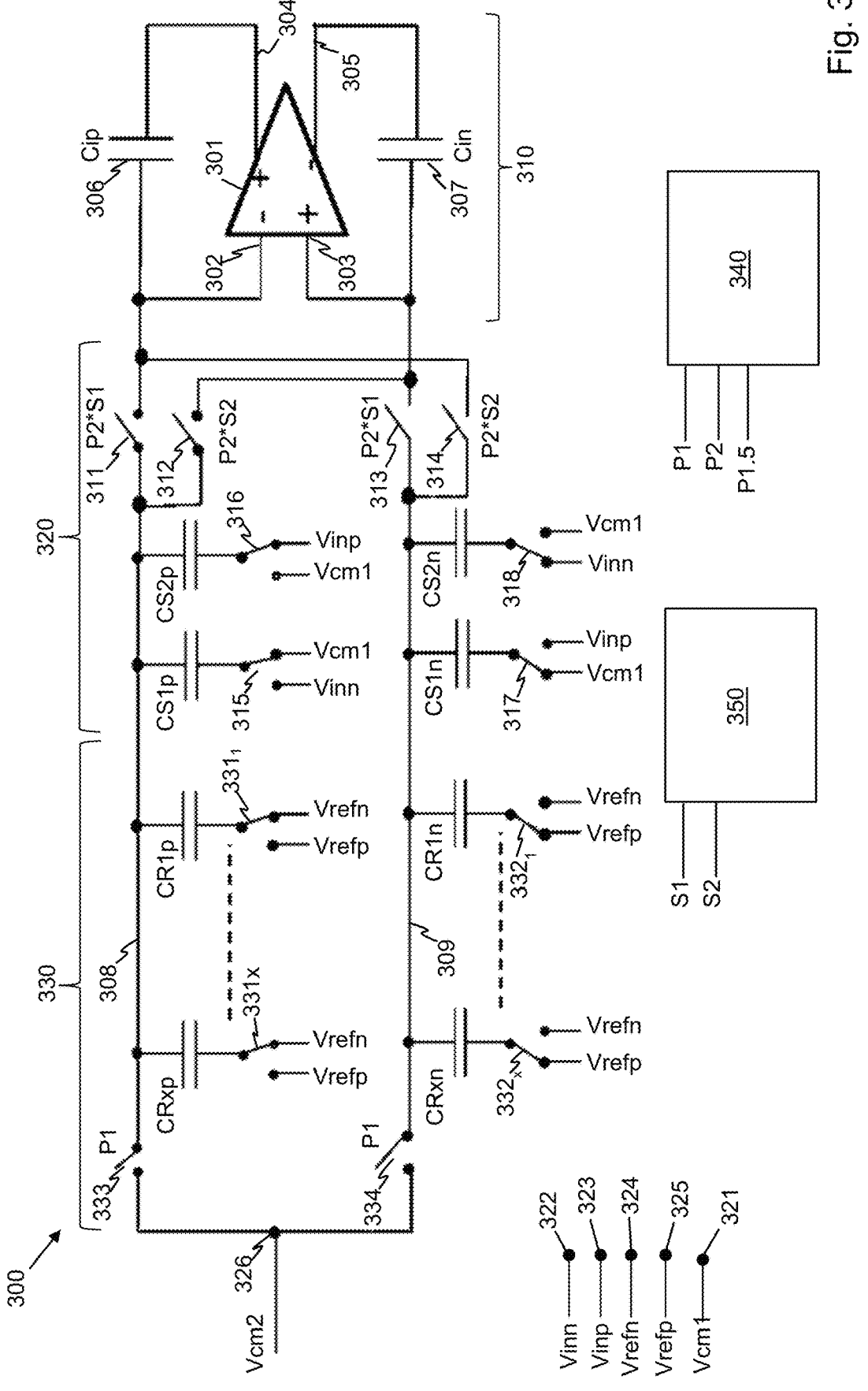
FIG. 3 is a schematic diagram of an example integrator circuit for a $\Sigma\Delta$ ADC.

The functions of the DAC 208, input summing node 209 and first stage integrator 201 may be combined in a first stage integrator circuit 300, an example of which is illustrated in FIG. 3. In this double sampling scheme, the SNR is improved without any significant increase of power consumption in the ADC driver or ΣΔ ADC.

In a general aspect, the integrator circuit 300 comprising an integrator module 310 comprising a differential amplifier 301, a sampling module 320 comprising sampling capacitors CS1$p$, CS2$p$, CS1$n$, CS2$n$ and a reference module 330 comprising first and second pluralities of reference capacitors $331_{1-x}$, $332_{1-x}$ connected between respective first and second lines 308, 309 and first and second pluralities of reference switches $331_{1-x}$, $332_{1-x}$ for connecting each of the reference capacitors $331_{1-x}$, $332_{1-x}$ to either a first reference terminal 324 or a second reference terminal 325. In operation, the reference switches $331_{1-x}$, $332_{1-x}$ are switched according to a thermometrically coded quantizer signal.

In the example illustrated in FIG. 3, the integrator module 310 comprises a differential amplifier 301 having first and second inputs 302, 303 and first and second outputs 304, 305. A first integrator capacitor Cip 306 is connected between the first input 302 and the first output 304 of the differential amplifier 301. A second integrator capacitor Cin 307 is connected between the second input 303 and the second output 305 of the differential amplifier 301. Input nodes of the integrator circuit 300 are connected to the first and second inputs 302, 303 of the differential amplifier 301.

A first line 308 of the integrator circuit 300 is switchably connected to the first input 302 of the differential amplifier 301 via a first switch 311 and to the second input of the differential amplifier 301 via a second switch 312.

A second line 309 of the integrator circuit 300 is switchably connected to the second input 303 of the differential amplifier 301 via a third switch 313 and to the first input 303 of the differential amplifier 301 via a fourth switch 314.

The first, second, third and fourth switches 311-314 are controlled by a clock phase signal P2 in combination with switching signals S1, S2, as described in further detail below.

A first sampling capacitor CS1$p$ is connected between the first line 308 and a fifth switch 315. A second sampling capacitor CS$p$2 is connected between the first line 308 and a sixth switch 316. A third sampling capacitor CS1$n$ is connected between the second line 309 and a seventh switch 317. A fourth sampling capacitor CS2$n$ is connected between the second line 309 and an eight switch 318.

The fifth switch 315 connects the first sampling capacitor CS1$p$ to either a first common terminal 321 or a first differential input terminal 322. The first common terminal 321 is indicated in FIG. 3 as providing a common voltage Vcm1. The first differential input terminal 322 provides a first (or negative) differential input voltage Vinn.

The sixth switch 316 connects the second sampling capacitor CS2$p$ to either the first common terminal 321 or a second differential input terminal 323. The second differential input terminal 323 provides a second (or positive) differential input voltage Vinp.

The seventh switch 317 connects the third sampling capacitor CS1$n$ to either the first common terminal 321 or the second differential input terminal 323.

The eighth switch 318 connects the fourth sampling capacitor CS2$n$ to either the first common terminal 321 or the first differential input terminal 322.

A first plurality of reference capacitors CR1$p$-CRxp is connected between the first line 308 and a respective first plurality of reference switches $331_1$-$331_x$. Each of the first plurality of reference switches $331_1$-$331_x$ connects a respective one of the first plurality of reference capacitors CR1$p$-CRxp to either a first reference terminal 324 or a second reference terminal 325. The first reference terminal 324 provides a first (or negative) reference buffer output voltage Vrefn. The second reference terminal 325 provides a second (or positive) reference buffer voltage output Vrefp.

A second plurality of reference capacitors CR1$n$-CRxn is connected between the second line 309 and a respective second plurality of reference switches $332_1$-$332_x$. Each of the second plurality of reference switches $332_1$-$332_x$ connects a respective one of the second plurality of reference capacitors CR1$n$-CRxn to either the first reference terminal 324 or the second reference terminal 325.

The first and second pluralities are equal in number. As indicated in FIG. 3, the number of the first and second pluralities of reference capacitors CR1$p$-CRxp, CR1$n$-CRxn is x, where x is an integer. The integer x may for example be 15, which corresponds to a quantizer resolution of 4 bits. In a general aspect, x may be equal to $2^N-1$, where N is a resolution of the quantizer. N may for example be 2, 3, 4, 5 or greater, depending on the resolution required.

The first and second pluralities of switches $331_{1-x}$, $332_{1-x}$ are switched between the reference voltages Vrefn, Vrefp according to a thermometrically-coded quantizer signal from the quantizer 206 (FIG. 2). In each of the plurality of switches $331_{1-x}$, $332_{1-x}$, the number of switches connected to one of the reference voltages is equal to the thermometrically coded quantizer signal. For example, if the number x is 15 and the quantizer signal is 15 or 0, all switches are connected to one of the reference voltages. If the quantizer signal is 7, 7 switches are connected to one reference voltage and the other 8 are connected to the other reference voltage.

The first line 308 is connected to a second common terminal 326 via a ninth switch 333. The second line 309 is connected to the second common terminal 326 via a tenth switch 334. Operation of each of the ninth and tenth switches is controlled by respective clock phase switching signals P1, P2 as described in further detail below.

The first and second common terminals 321, 326 may connect to a different common voltages or may connect to the same common voltage, i.e. the first and second common terminals 321, 326 may in some examples be connected to each other.

The sampling capacitors CS1p, CS2p, CS1n, CS2n and the reference capacitors CR1p-CRxp, CR1n-CRxn are separate in order to enable a constant switching current load at the reference buffer outputs Vrefp, Vrefn.

A clock signal generator 340 generates clock signals P1, P2 and P1.5 to drive the various switches 311-318. A switch control module 350 generates first and second switching signals S1, S2 for controlling the first to eighth switches 311-318 in combination with the clock signals P1, P2, P1.5, as described in further detail below.

Figure 4:
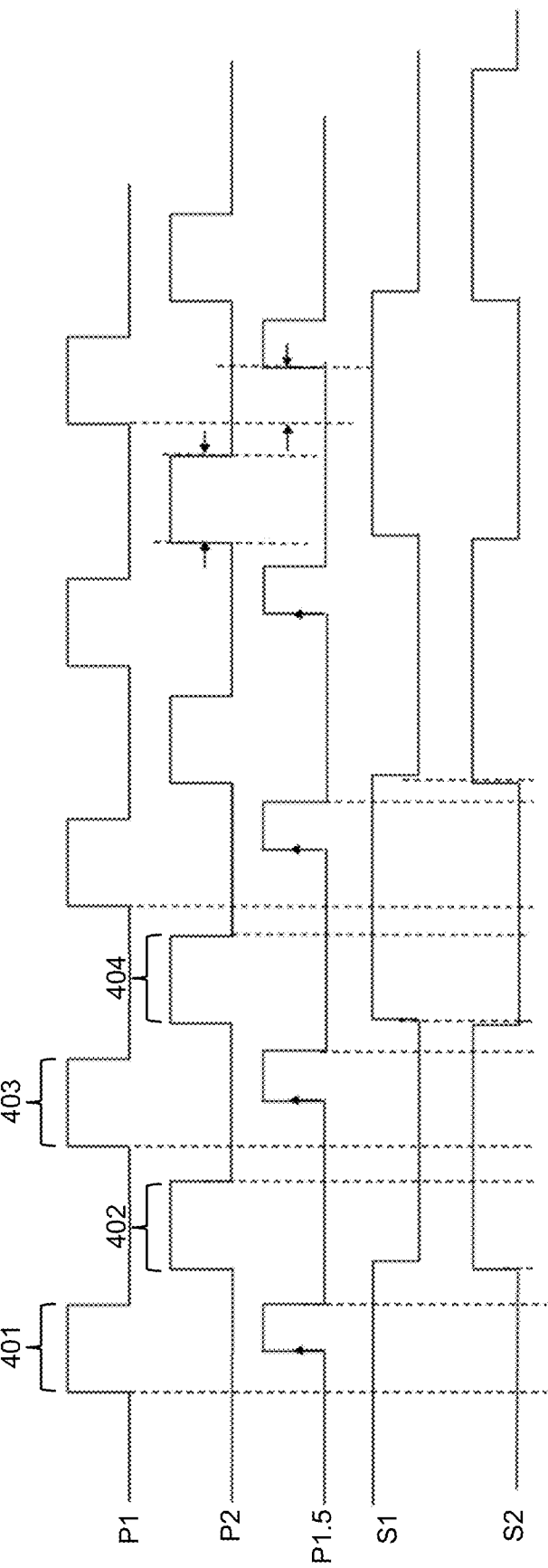
FIG. 4 is a timing diagram for the integrator circuit of FIG. 3 covering sampling and integration phases.

FIG. 4 illustrates a switching timing diagram for operating the integrator circuit 300 of FIG. 3. First and second non-overlapping clock phase signals P1, P2 are provided by the clock signal generator 340. The first clock phase signal P1 defines a sampling phase 401 and the second clock phase signal P2 defines an integration phase 402. A third clock phase signal P1.5 has a period less than (for example half of) the first clock phase signal P1. The third clock phase signal P1.5 is shown in FIG. 4 as having pulses with rising edges that follow a rising edge of the first clock phase signal P1 and falling edges that are coincident with a falling edge of the first clock phase signal P1.

First and second switching signals S1, S2 provided by the switch control module 350 control operation of the first to eighth switches 311-318, with clock phase signals P1, P2 in combination with the first and second switching signals S1, S2 for the first to fourth switches 311-314. The first and second switching signals S1, S2 each have twice the period of the clock phase signals P1, P2. The second switching signal S2 is the inverse of the first switching signal S1. Rising edges of the first switching signal coincide with rising edges of the second clock phase signal P2.

At the start of a first sampling phase 401, the first clock phase signal P1 is high, closing the ninth and tenth switches 333, 334 and causing the first and second lines 308, 309 to be connected to Vcm2. S1 is high, causing the input signals Vinp, Vinn to be sampled across the first and second sampling capacitors CS1p, CS2p, CS1n, CS2n. At the same time, the quantizer 206 inside the sigma delta loop starts conversion. The quantizer 206 is expected to complete conversion before the start of the rising edge of clock signal P1.5.

Towards the end of the sampling phase 401, the second sampling capacitor CS2p is charged to Vinp, while the first sampling capacitor CS1p is charged to Vcm1. On the negative side, during the sampling phase 401 the third sampling capacitor CS1n is charged to Vcm1 and the fourth sampling capacitor CS2n is charged to Vinn. The switch positions for switches 315-318 during the sampling phase 401 are those indicated in FIG. 3.

Connections to the reference capacitors CR1p-xp, CR1n-xn are controlled by operating the first and second plurality of reference switches $331_{1-x}$, $332_{1-x}$, which are controlled by a thermometrically coded output from the quantizer 206. In the example circuit in FIG. 3, the reference capacitors CR1p-CRxp, CR1n-CRxn on the first and second lines 308, 309 are controlled by thermometric outputs T1-Tx and inverted thermometric outputs T1b-Txb, where x is the number of switches in each of the first and second plurality of switches. During the first sampling phase 401, the inverted thermometrically coded outputs T1b-Txb control the first and second plurality of reference switches $331_{1-x}$, $332_{1-x}$.

At the end of the sampling phase 401, the first phase clock signal P1 goes low, opening switches 333, 334. Following the sampling phase 401, at the start of a first integrating phase 402 the first switching signal S1 goes low and the second switching signal S2 goes high. On the positive side of the sampling module 320, this causes the first sampling capacitor CS1p to be connected to Vinn and the second sampling capacitor CS2p to be connected to Vcm1. On the negative side of the sampling module 320, the third sampling capacitor CS1n is connected to Vinp and the fourth sampling capacitor CS2n is connected to Vcm1. During this integration phase 402, the first and second plurality of reference switches $331_{1-x}$, $332_{1-x}$ connecting the reference capacitors CR1p-CRxp, CR1n-CRxn to either Vrefn or Vrefp are controlled by the thermometric outputs T1-Tx from the quantizer 216.

After the first integration phase 402, the quantizer 206 starts converting the integrator outputs into digital in a second sampling phase 403. At the same time, all the sampling capacitors CS1p, CS2p, CS1n, CS2n remain connected to the same inputs as for the first integration phase 402. During the P1.5 phase, connections to all reference capacitors CR1p-xp, CR1n-xn are controlled by thermometric outputs from the quantizer. It is expected that the quantizer 216 will complete conversion before the rising edge of each P1.5 clock signal.

At the start of a second integrating phase 404, the first switching signal S1 goes high and the second switching signal S2 goes low. On the positive side, this causes the first sampling capacitor CS1p to be connected to Vinp and the second sampling capacitor CS2p to be connected to Vcm1. On the negative side, the third sampling capacitor CS1n is connected to Vcm1 and the fourth sampling capacitor CS2n is connected to Vinn. During this second integration phase 404, the first and second plurality of reference switches $331_{1-x}$, $332_{1-x}$ connect the reference capacitors CR1p-CRxp, CR1n-CRxn to Vrefn, Vrefp according to the inverted thermometric outputs T1b-Txb from the quantizer 216. After the second integration phase 404, the quantizer 206 starts converting the integrator outputs into digital in the next sampling phase. At the same time, the sampling capacitors CS1p, CS2p, CS1n, CS2n remain connected to the same inputs as for the second integration phase 404. During the P1.5 phase, all the reference capacitors CR1p-xp, CR1n-xn remain connected by the reference switches $331_{1-x}$, $332_{1-x}$ according to the inverted thermometric outputs T1b-Txb from the quantizer 216. It is expected that the quantizer completes conversion before the rising edge of the next P1.5 pulse.

In the next integration phase, S1 goes low and S2 goes high and the above-described cycles of sampling and integration repeat.

Noise-Calculation

With the sampling capacitors CS1p, CS2p, CS1n, CS1n all being nominally equal to the same sampling capacitance Cs, i.e. CS1p=CS2p=CS1n=CS2n=Cs, the total RMS input referred noise Vn,rms may be given by the following relationship:

$$V_{n,rms} = 0.5\sqrt{(4KT/C_s)(2 + CR/C_s)}$$

where CR is the capacitance of each of the reference capacitors CR1p-CRxp, CR1n-CRxn.

Without double sampling the relationship is:

$$V_{n,rms} = \sqrt{(4KT/C_s)(1 + CR/C_s)}$$

In a typical high order $\Sigma\Delta$ ADC, the maximum stable input range is less than the reference range, so CR/Cs>1. In a typical case when CR/Cs>1.5, it turns out that the rms input referred noise level with the proposed double sampling scheme is around 4.6 dB lower. In other words, the SNR increases by 4.6 dB as compared to the case without double sampling.

In addition to this, during the full switching periods S1 and S2 only one sampling unit (CS1p/n or CS2p/n) is connected to the input and the signal swing is always from Vcm1 to Vinp/Vinn or vice versa. So the proposed double sampling scheme does not demand an additional switching current from the ADC driver/buffer stage, in comparison to some conventional double sampling methods. In addition, in the proposed double sampling scheme there are always four switches (i.e. switches 311-314) irrespective of the quantizer resolution. In a multibit $\Sigma\Delta$ ADC this can eliminate the source of additional offset or gain drift due to supply or temperature variation, unlike in the case of conventional double sampling.

Implementation

Figure 5:
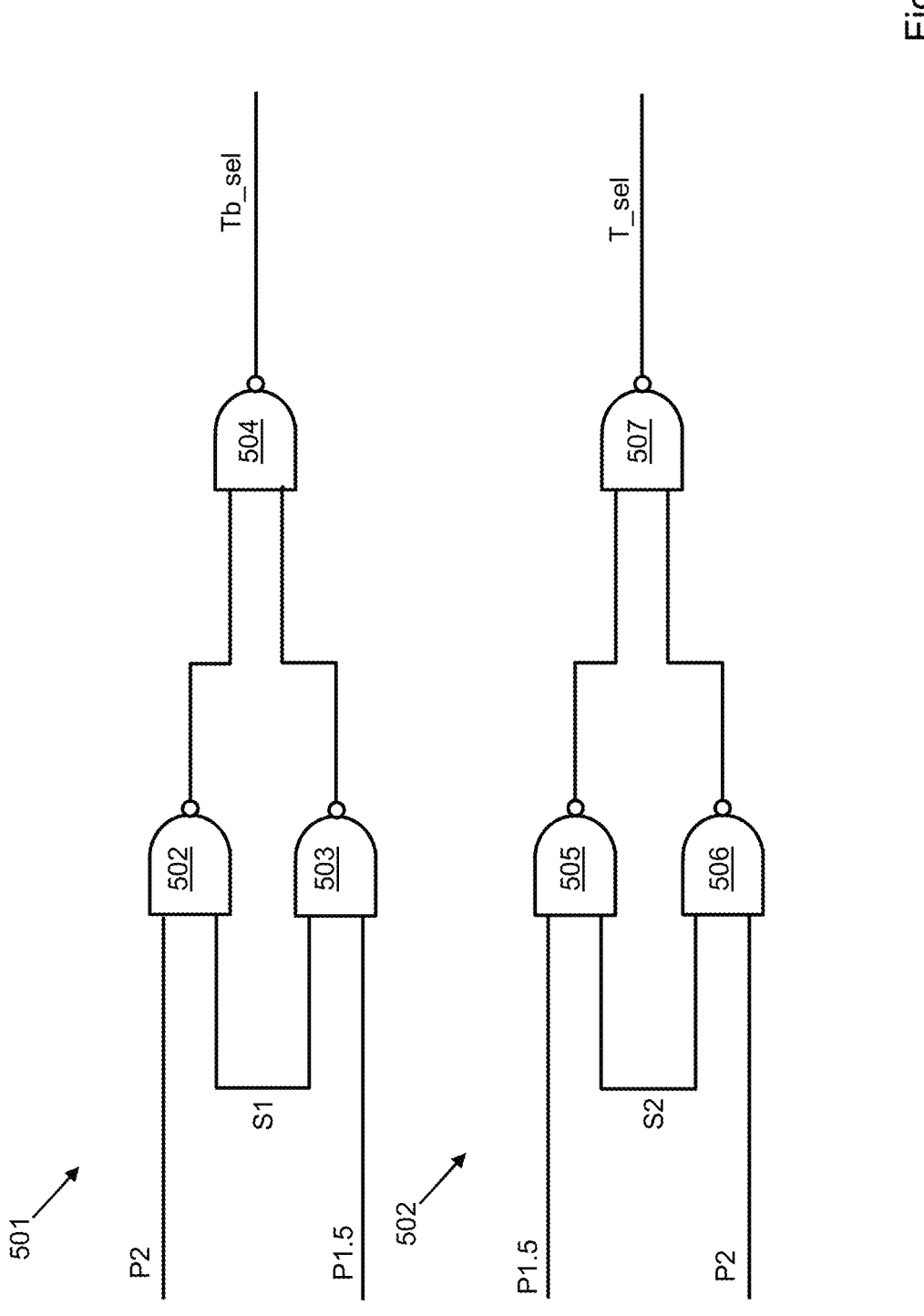
FIG. 5 is a schematic diagram of a logic circuit for controlling switching of reference capacitors of the integrator circuit of FIG. 3.

Example logic circuits 501, 502 for controlling the reference switches $331_{1-x}$, $332_{1-x}$ are illustrated in FIG. 5. A first logic circuit 501 comprises first, second and third NAND gates 502, 503, 504. Signals P2 and S1 are provided to inputs of the first NAND gate 502. Signals P1.5 and S1 are provided to inputs of the second NAND gate 503. Outputs of the first and second NAND gates 502, 503 are provided as inputs to the third NAND gate 504, which outputs the inverted thermometric control signal Tb_sel. As shown in the timing diagram in FIG. 4, connections to all the reference capacitors are controlled by either T1 . . . . T15 or T1b . . . . T15b, being the thermometric and inverse thermometric outputs from the quantizer. If T_sel is high, connections to the reference capacitors will be controlled by T1 . . . . T15 and if Tb_sel is high, connections to the reference capacitors will be controlled by T1b . . . . T15b. A second logic circuit 502 comprises first, second and third NAND gates 505, 506, 507. Signals P1.5 and S2 are provided to inputs of the first NAND gate 505. Signals P2 and S2 are provided to inputs of the second NAND gate 506. Outputs of the first and second NAND gates 505, 506 are provided as inputs to the third NAND gate 507, which outputs the thermometric control signal T_sel.

The proposed double sampling scheme described above may be implemented in a 3rd order CIFF (cascade-of-integrators with feedforward) sigma delta modulator. A schematic diagram of an example 3rd order CIFF modulator 200 is illustrated in FIG. 2. The modulator 200 consists of three stage integrators 201, 202, 203 and a 4 bit quantizer 206. Thermometrically coded outputs from the quantizer 206 control the connections to the reference capacitors in the integrator circuit. The quantizer 206 may be implemented using an asynchronous SAR ADC to meet the required conversion time of Ts/4, where Ts is the sampling period corresponding to the periods of clock phase signals P1, P2. The sampling period in a particular implementation may for example be around 500 ns.

The proposed double sampling network is implemented with real devices and 3rd order modulator is simulated. An output spectrum is shown in FIG. 7. Here, modulator operates at 2 MHz and SNR is calculated @ OSR=64.

Figure 6:
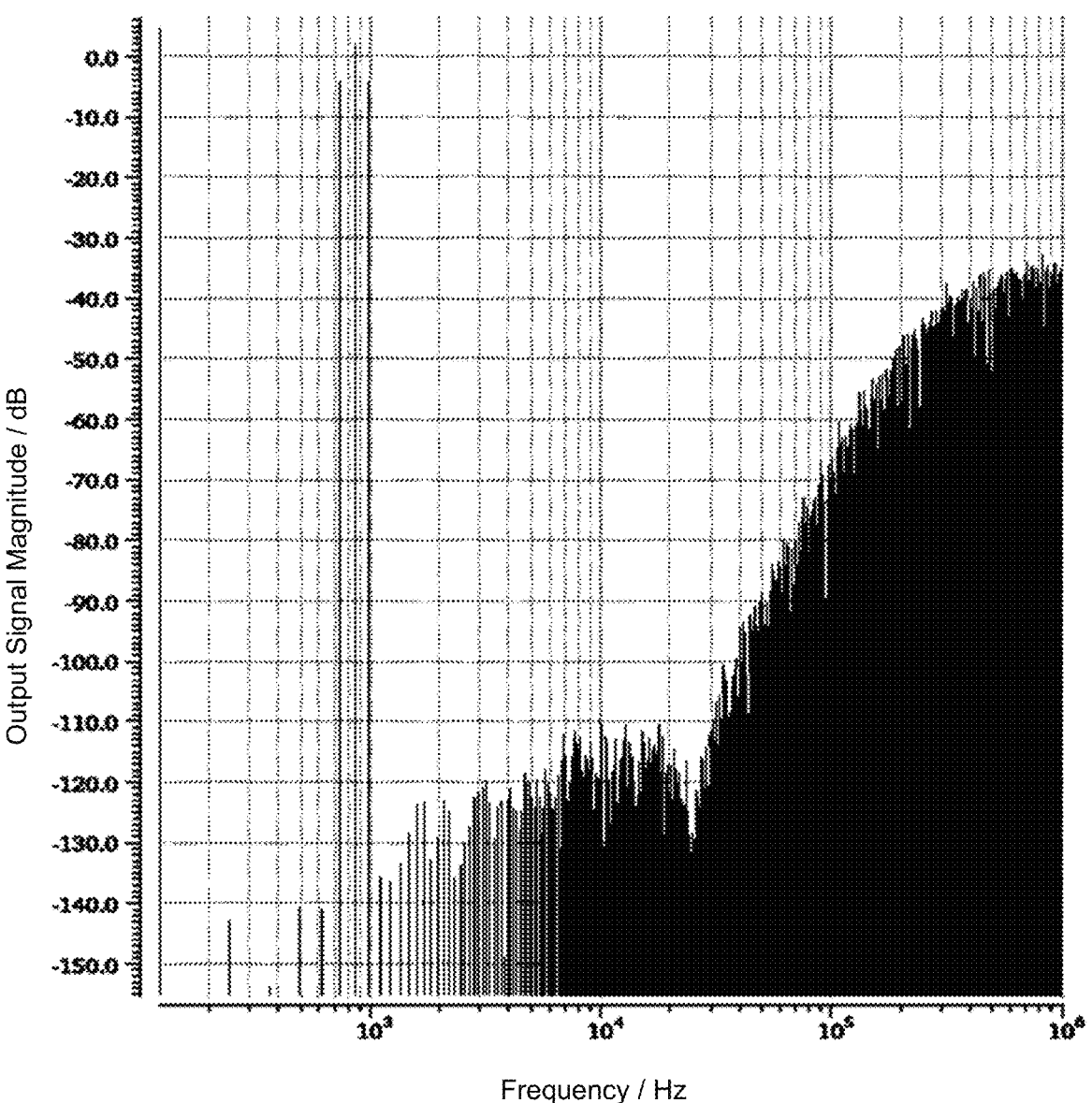
FIG. 6 is an example output spectrum plot for a $\Sigma\Delta$ modulator incorporating an integrator according to FIG. 3.

FIG. 6 illustrates a simulated output SNR frequency spectrum of an example third order sigma delta modulator of the type described herein, using the switched capacitor scheme described above. The SNR was calculated from the signal power and noise power for each frequency band in the spectrum.

From reading the present disclosure, other variations and modifications will be apparent to the skilled person. Such variations and modifications may involve equivalent and other features which are already known in the art of sigma delta modulators, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. An integrator circuit for a Sigma-Delta ($\Sigma\Delta$) modulator, the integrator circuit comprising:

an integrator module comprising a differential amplifier having first and second inputs and first and second outputs, a first integrator capacitor connected between the first input and the first output, a second integrator capacitor connected between the second input and the second output;

a first line switchably connected to the first input of the differential amplifier via a first switch and to the second input of the differential amplifier via a second switch;

a second line switchably connected to the second input of the differential amplifier via a third switch and to the first input of the differential amplifier via a fourth switch;

first and second sampling capacitors connected between the first line and respective fifth and sixth switches, the fifth switch connecting the first sampling capacitor to either a first common terminal or a first differential input terminal, the sixth switch connecting the second sampling capacitor to either the first common terminal or a second differential input terminal;

third and fourth sampling capacitors connected between the second line and respective seventh and eighth switches, the seventh switch connecting the third sampling capacitor to either the first common terminal or the second differential input terminal, the eighth switch connecting the fourth sampling capacitor to either the first common terminal or the first differential input terminal;

a first plurality of reference capacitors connected between the first line and a respective first plurality of reference switches, each of the first plurality of reference switches connecting a respective one of the first plurality of reference capacitors to either a first reference terminal or a second reference terminal;

a second plurality of reference capacitors connected between the second line and a respective second plurality of reference switches, each of the second plurality of reference switches connecting a respective one of the second plurality of reference capacitors to either the first reference terminal or the second reference terminal;

a ninth switch connected between a second common terminal and the first line; and a tenth switch connected between the second common terminal and the second line.

2. The integrator circuit of claim 1, wherein the first and second pluralities of reference capacitors are equal in number.

3. The integrator circuit of claim 2, wherein the first and second pluralities are equal to $2^N-1$, where N is an integer greater than 1.

4. The integrator circuit of claim 3, wherein the first and second pluralities are equal to 15.

5. The integrator circuit of claim 1, wherein the first and second pluralities of reference capacitors have equal capacitance values.

6. The integrator circuit of claim 1, comprising a clock signal generator configured to generate first and second non-overlapping clock signals.

7. The integrator circuit of claim 6, wherein the first and second non-overlapping clock signals are of equal frequency.

8. The integrator circuit of claim 6, comprising a switch control module configured to generate first and second switching signals for control of the first to eighth switches in combination with the first and second clock signals.

9. The integrator circuit of claim 8, wherein the first and second switching signals have a period twice that of the first and second non-overlapping clock signals, the second switching signal being an inverse of the first switching signal.

10. The integrator circuit of claim 1, wherein the first, second, third and fourth sampling capacitors have equal capacitance values.

11. A Sigma-Delta ($\Sigma\Delta$) modulator comprising the integrator circuit according to claim 1 and a quantizer, wherein the quantizer is configured to provide a thermometrically coded output signal to operate the reference switches.

12. A method of operating an integrator circuit for a Sigma-Delta ($\Sigma\Delta$) modulator, the integrator circuit comprising:

an integrator module comprising a differential amplifier having first and second inputs and first and second outputs, a first integrator capacitor connected between the first input and the first output, a second integrator capacitor connected between the second input and the second output;

a first line switchably connected to the first input of the differential amplifier via a first switch and to the second input of the differential amplifier via a second switch;

a second line switchably connected to the second input of the differential amplifier via a third switch and to the first input of the differential amplifier via a fourth switch;

first and second sampling capacitors connected between the first line and respective fifth and sixth switches, the fifth switch connecting the first sampling capacitor to either a first common terminal or a first differential input terminal, the sixth switch connecting the second sampling capacitor to either the first common terminal or a second differential input terminal;

third and fourth sampling capacitors connected between the second line and respective seventh and eighth switches, the seventh switch connecting the third sampling capacitor to either the first common terminal or the second differential input terminal, the eighth switch connecting the fourth sampling capacitor to either the first common terminal or the first differential input terminal;

a first plurality of reference capacitors connected between the first line and a respective first plurality of reference switches, each of the first plurality of reference switches connecting a respective one of the first plurality of reference capacitors to either a first reference terminal or a second reference terminal;

a second plurality of reference capacitors connected between the second line and a respective second plurality of reference switches, each of the second plurality of reference switches connecting a respective one of the second plurality of reference capacitors to either the first reference terminal or the second reference terminal;

a ninth switch connected between a second common terminal and the first line; and a tenth switch connected between the second common terminal and the second line, the method comprising in sequence:

in a first sampling phase:

providing a first clock signal to close the ninth and tenth switches;

providing a first switching signal to operate the fifth, sixth, seventh and eighth switches to connect the first sampling capacitor to the first common terminal, the second sampling capacitor to the second differential input terminal, the third sampling capacitor to the first common terminal and the fourth capacitor to the first differential input terminal;

providing a thermometrically coded quantizer signal to operate the reference switches, connecting each of the first and second plurality of reference capacitors to either the first or second reference terminals;

in a first integration phase:

opening the ninth and tenth switches; and providing a second switching signal and a second clock signal to close the second and fourth switches.

13. The method of claim 12, further comprising:

in a second sampling phase:

providing the first clock signal to close the ninth and tenth switches;

providing the second switching signal to operate the fifth, sixth, seventh and eighth switches to connect the first sampling capacitor to the first differential input terminal, the second sampling capacitor to the first common terminal, the third sampling capacitor to the second differential input terminal and the fourth capacitor to the first common terminal;

in a second integration phase:

providing an inverse of the thermometrically coded quantizer signal to operate the reference switches, connecting each of the first and second plurality of reference capacitors to either the first or second reference terminals;

opening the ninth and tenth switches; and providing the first switching signal and the second clock signal to close the first and third switches.

14. The method of claim 13, wherein the sequence of the first sampling phase, the first integration phase, the second sampling phase and the second integration phase is repeated.

15. The method of claim 12, wherein the first and second clock signals are non- overlapping.

16. The method of claim 15, wherein the first and second clock signals are of equal frequency.

17. The method of claim 16, wherein the first and second switching signals have a period twice that of the first and second clock signals, the second switching signal being an inverse of the first switching signal.

18. The method of claim 12 wherein, for each of the first and second pluralities of reference switches, the number of reference switches connected to one of the reference terminals is equal to the thermometrically coded quantizer signal.

19. The method of claim 18, wherein the first and second pluralities are equal to $2^N-1$, where N is an integer greater than 1.

20. The method of claim 19, wherein the first and second pluralities are equal to 15.

\*   \*   \*   \*   \*